United States Patent [19]
Shin

[11] Patent Number: 5,892,473
[45] Date of Patent: Apr. 6, 1999

[54] SWITCHED CAPACITOR DIGITAL-ANALOG CONVERTER WITH A DECREASED HARMONIC DISTORTION

[75] Inventor: Yun Tae Shin, Ichon, Rep. of Korea

[73] Assignee: Hyundai Electronics Industries Co., Ltd., Ichon-shi, Rep. of Korea

[21] Appl. No.: 872,934

[22] Filed: Jun. 11, 1997

[30] Foreign Application Priority Data

Jun. 24, 1996 [KR] Rep. of Korea ...................... 96-23279

[51] Int. Cl.[6] .................................................. H03M 1/66
[52] U.S. Cl. ........................................... 341/150; 341/144
[58] Field of Search ..................................... 341/172, 150, 341/143, 144; 327/334, 337, 551, 554, 558; 333/173, 174

[56] References Cited

U.S. PATENT DOCUMENTS

| | | | |
|---|---|---|---|
| 4,574,250 | 3/1986 | Senderowicz | 330/258 |
| 5,245,344 | 9/1993 | Sooch | 341/150 |
| 5,323,158 | 6/1994 | Ferguson, Jr. | 341/143 |
| 5,359,294 | 10/1994 | Ganger et al. | 330/258 |
| 5,376,936 | 12/1994 | Kerth et al. | 341/150 |
| 5,467,089 | 11/1995 | Draxelmayr | 341/150 |
| 5,699,016 | 12/1997 | Federspiel et al. | 330/260 |
| 5,745,002 | 4/1998 | Baschirotto et al. | 327/554 |
| 5,805,019 | 9/1998 | Shin | 330/9 |

*Primary Examiner*—Howard L. Williams
*Assistant Examiner*—Peguy JeanPierre
*Attorney, Agent, or Firm*—Thelen, Reid & Priest LLP.

[57] ABSTRACT

In a D/A converter employed in audio systems and various communicating equipment, particularly for using a digital 1-bit data stream as an input and an analog signal as an output, a switched capacitor digital-analog converter having a decreased harmonic distortion utilizes a charge subtraction method in a low-pass filter instead of employing a bypass filter to prevent an operational amplifier from deviating from a linear range due to a switching noise. The bypass capacitor heretofore used in the D/A converter is not employed to shrink the chip designing area.

4 Claims, 6 Drawing Sheets

SWITCHED CAPACITOR DIGITAL-ANALOG CONVERTER WITH A DECREASED HARMONIC DISTORTION

BACKGROUND OF THE INVENTION

1. Field of the Invention

The present invention relates to a digital-to-analog converter used for audio systems and various communicating equipment, and more particularly to, a switched capacitor digital-to-analog (hereinafter simply referred to as "D/A") converter for effectively decreasing harmonic distortion and shrinking the designing area by means of analog switches and capacitors, in a data converter using a digital 1-bit data stream as an input and an analog signal as an output.

2. Description of the Prior Art

D/A converters generally function to convert a signal received in a digital state into a signal in an analog state. Preferably, such a D/A converter is operated within a linear input range and has a larger dynamic range.

Currently, the most widely used method is to increase the dynamic range while heightening resolution in low frequency signals below 100 KHz, i.e., an oversampling technique using a delta-sigma system.

In considering the conventional D/A converter having the above-stated characteristics, a circuit as shown in FIG. 1 may be given as one example, especially, the D/A converter having the formation as shown in FIG. 1 is called as a switched capacitor 1-bit D/A converter.

The circuit includes a D/A converter section 40 formed by a first signal input section 10 consisting of a plurality of analog switches DSW1d, /DSW1d, SW1, SW2 and SW2d and capacitors C1 for receiving a digital 1-bit data stream, and first and second resistor sections 20 having bypass capacitors $C_B$ for decreasing high frequency components of a signal received via first signal input section 10 to lead a first fully-differential operational amplifier 30 to operate within a linear input range and a plurality of analog switches SW1, SW1d, SW2 and SW2d for attenuating the high frequency components of a value provided from first fully-differential operational amplifier 30. First fully-differential operational amplifier 30 performs an arithmetic operation of signals received via aforementioned respective sections to amplify them. Also included as a part of the circuit is a switched capacitor low-pass filter 50 which uses the signal supplied from first fully-differential operational amplifier 30 as an input to eliminate a high frequency noise.

Switched capacitor low-pass filter 50 illustrated in detail in FIG. 2 includes a second signal input section 51 formed by a plurality of analog switches SW1, SW1d, SW2 and SW2d and capacitors C3 for receiving the signal supplied from first fully-differential operational amplifier 30. In addition, a second fully-differential operational amplifier 52 is amplified to provide the signal received via second signal input section 51, and third and fourth resistor sections 53 are provided for removing the high frequency noise produced when a voltage is transmitted from second signal input section 51 to second fully-differential operational amplifier 52.

Here, analog switches SW1 and SW2 within second signal input section 51, analog switches SW1d and SW2d within third and fourth resistor sections 53 and capacitors C4 serve as the low-pass filter having a cutoff frequency of $$\frac{fC_4}{2\pi C_5}$$

(where reference alphabet f denotes a clock frequency shown in FIG. 3) together with capacitors C5 connected between the input and output terminals of second fully-differential operational amplifier 52.

The operation of the switched capacitor D/A converter as constructed above will be described.

Among the reference symbols in connection with the switches illustrated, a difference between the reference symbols SWn (n=1,2) and SWnd (n=1,2) is that switch SWnd is operated by delaying a predetermined time period after switch SWn is operated in accordance with the timing chart as shown in FIG. 3.

That is, the timing chart of FIG. 3 represents one example of a phase for rendering respective analog switches SW1, SW1d, SW2 and SW2d to be on or off.

Respective analog switches are formed of MOS transistors as shown in FIG. 3.

In association with the operation in D/A converter section 40, when switches SW1d are on after turning on switches SW1, both ends of capacitors C1 of first signal input section 10 are respectively charged with a voltage of $V_{ref+}-0$ (voltage at both ends of the upper capacitor) and a voltage of $V_{ref-}-0$ (voltage at both ends of the lower capacitor) if the digital 1-bit data stream D is high while being charged with voltage of $V_{ref-}-0$ (that is at both ends of the lower capacitor) and voltage of $V_{ref+}-0$ (that is at both ends of the upper capacitor) if the digital 1-bit data stream D is low. Also, the voltages at both ends of capacitors $C_R$ of first and second resistor sections 20 becomes zero.

At this time, switches SW2 and SW2d connected between capacitors C1 of first signal input section 10 and capacitors $C_R$ of first and second resistors 20 are in the off state.

When switches SW2 and then switch SW2d are on after switch SW1d is off in accordance with the phase of the input clock for controlling operation of overall switches upon the completion of the charging operation, the voltage charging up capacitor C1 of first signal input section 10 is applied to the input terminals − and + of first fully-differential operational amplifier 30. Additionally, since one side of capacitors $C_R$ of first and second resistor sections 20 are connected to output terminals + and − of first fully-differential operational amplifier 30, the charged voltage becomes discharged to capacitors $C_R$ of first and second resistor sections 20. At this time, the magnitude of a switching noise ocurring at a moment (an interval of the clock transiting from low to high) that the switches are to be on in accordance with the size of switches SW1, the rising and falling edges of the clock, the time of a non-overlapping clock and the size of capacitors C1. This noise is imposed upon the input of first fully-differential operational amplifier 30, so that the output signal is instantaneously deviated from a linear range. For this reason, a distorted signal is produced to decrease the dynamic range.

In order to prevent this incident, bypass capacitors $C_B$ are connected between both ends of input terminals of first fully-differential operational amplifier 30 to decrease the magnitude of the voltage switching noise by an $RC_B$ time constant (where R denotes a resistance value of switch SW2). Then, the output involves the signal operated with the linear range to enhance the dynamic range. Here, first fully-differential operational amplifier 30 is operated as the low-pass filter having a cutoff frequency of by feedback capacitors C2 of first fully-differential operational amplifier 30 and capacitors $C_R$ of first and second resistor sections 20, thereby eliminating the high frequency components.

The output voltage of first fully-differential operational amplifier 30 of which high frequency components are eliminated is supplied to switched capacitor low-pass filter 50.

In describing the operation of switched capacitor low-pass filter 50, respective switches are operated in accordance with the clock phase shown in FIG. 3 as in the description with reference to FIG. 1, and this clock is applied to gates of the switches to turn on or off respective switches.

As shown in FIG. 2 in switched capacitor low-pass filter 50 operated with the same principle as D/A converter section 40 of FIG. 1, when switches SW1d are on after switches SW1 are on the output voltage of first fully-differential operational amplifier 30 charges respective capacitors C3 of second signal input section 51. Also, the voltages of both ends of capacitors C2 of third and fourth resistor sections 53 are discharged to be zero.

After switches SW1d are off in accordance with the phase of the input clock (refer to FIG. 3) for controlling the operation of overall switches upon completing the charging prior to turning on switches SW2 and then switches SW2d, the voltages charging up capacitors C3 of second signal input section 51 are applied to input terminals − and + of second fully-differential operational amplifier 52. Since one sides of capacitors C4 of third and fourth resistors 53 are connected to output terminals + and − of capacitors C4 of third and fourth resistors 53, the charging voltage is discharged to capacitors C4 of third and fourth resistors 53. Consequently, switched capacitor low-pass filter 50 functions as the low-pass filter having a cutoff frequency of $$\frac{C_4}{2\pi C5}$$

by feedback capacitors C5 as in D/A converter section 40 of FIG. 1.

In order to prevent the appearance of distortion at the output of the operational amplifiers resulting from the switching noise of the high frequency components produced from the input terminals of the operational amplifiers as described hereinbefore, conventional D/A converter operated as described above adopts a method for connecting the capacitors (bypass capacitor) to the input terminals of the operational amplifier to make the output of the operational amplifier operate within the linear range.

Therefore, the larger the value of bypass capacitors $C_B$ is (i.e., the value of $C_B$ which satisfies the relation that $RC_B$ time constant is less than {1/[2×clock frequency]}), the increased linear range of the fully-differential operational amplifier is obtained. Thus, total harmonic distortion is decreased and the dynamic range is increased.

As one example, at Phillips Co., Ltd., a chip is currently being designed by using a large capacitor such as 85 pF to 16-bit audio D/A converter.

However, if the capacitance of the capacitor is increased as above, the capacitor cannot be provided in the interior of the chip in its design. For this reason, it is designed to connect the bypass capacitor to the outside of the chip in the D/A converter.

Such a construction is unfavorable for current products directed toward achieving high miniaturization due to occupying too wide an area. In contrast, when the capacitance of bypass capacitor $C_B$ is small, the dynamic range is decreased.

SUMMARY OF THE INVENTION

An objective of the present invention to provide a D/A converter, wherein, in order to solve the above enumerated conventional problems, a charge subtraction method is used without employing the bypass capacitor for preventing an operational amplifier from being deviated from a linear range incited due to a switching noise.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 1:
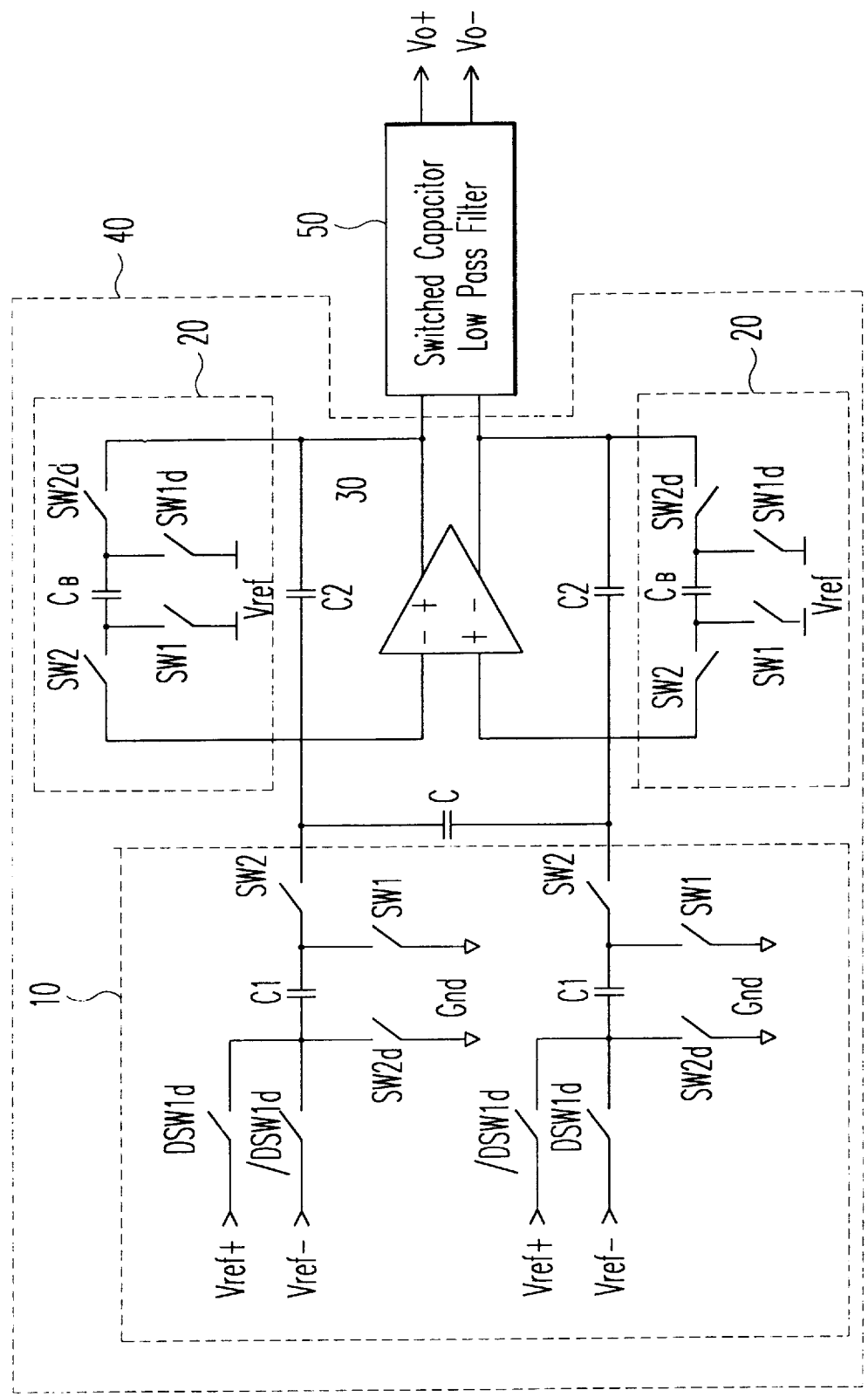
FIG. 1 is a circuit diagram showing a conventional switched capacitor D/A converter.
Figure 2:
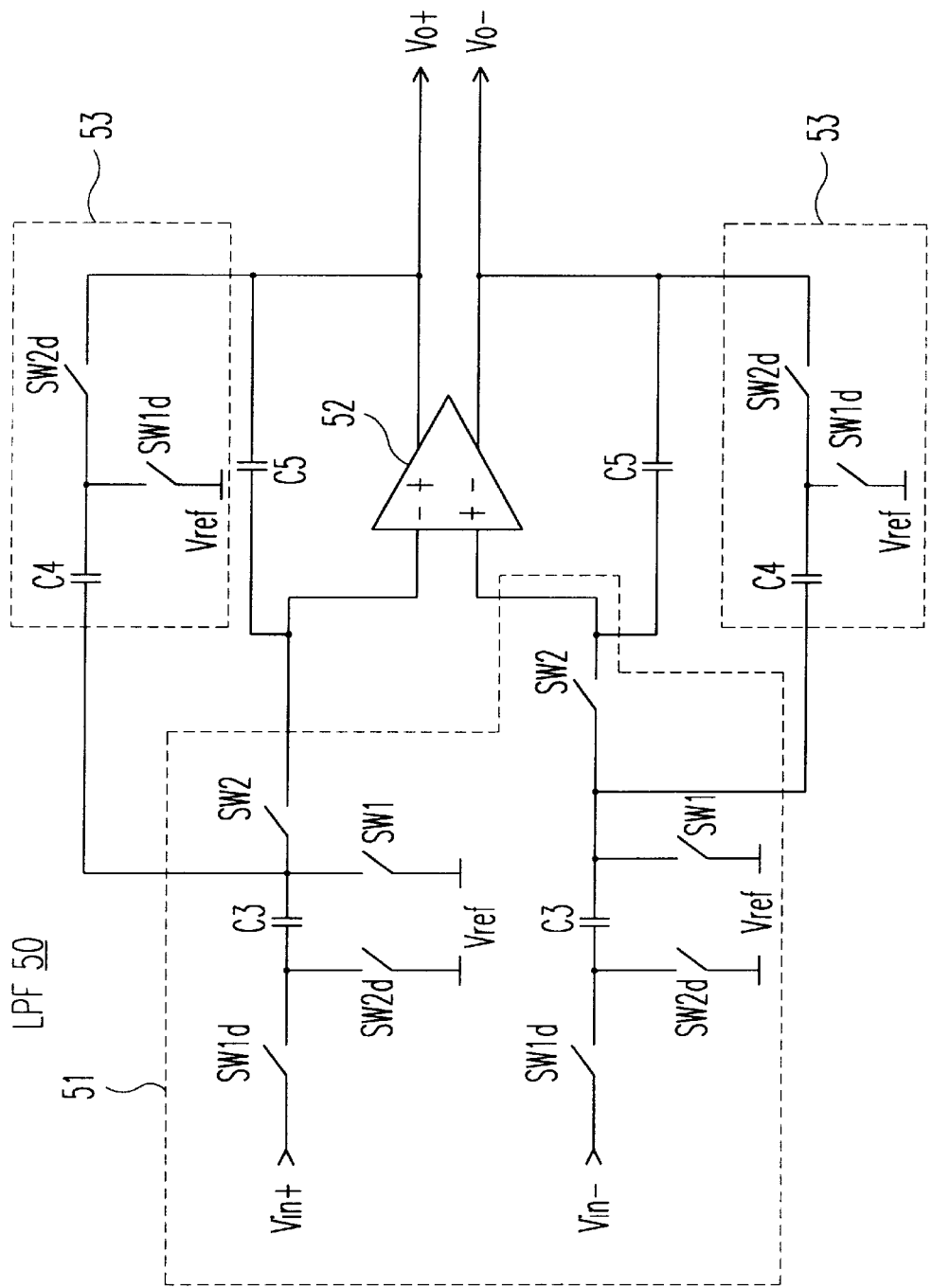
FIG. 2 is a detailed circuit diagram of the switched capacitor low-pass filter of FIG. 1.

In a switched capacitor D/A converter according to the present invention, circuits connected to respective input terminals of fully-differential operational amplifiers are symmetric up and down, and the upper portion is marked by $_p$ (positive) which denotes '+' and the lower portion is by $_n$ (negative) which denotes '−' to identify respective capacitors. Simultaneously-operated switches are designated by the same reference numerals throughout the drawings for description.

Figure 4:
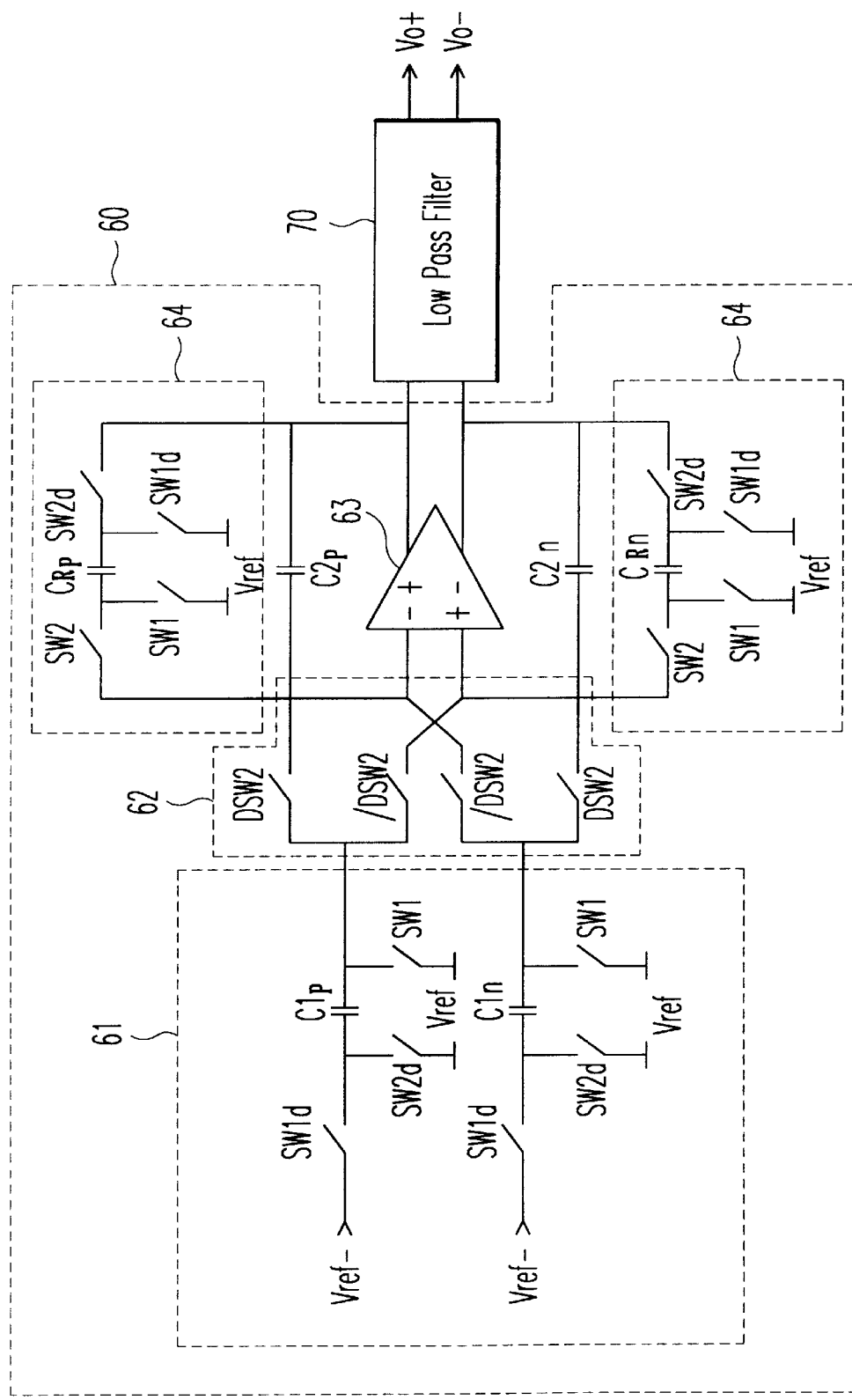
FIG. 4 is a circuit diagram of a switched capacitor D/A converter according to the present invention.

FIG. 4 is a circuit diagram of the one-bit switched capacitor D/A converter embodied according to the present invention having a decreased harmonic distortion. Here, D/A converter section 60 includes a reference voltage supply section 61 formed by a plurality of analog switches SW1, SW1d, SW2 and SW2d and capacitors $C1_p$ and $C1_n$, and a digital signal input section 62 for supplying voltages received via reference voltage supply section 61 to a third fully-differential operational amplifier 63 in accordance with digital 1-bit data stream signal D and D. Also provided as parts of D/A converter section 60 are third fully-differential operational amplifier 63 for amplifying the voltage supplied via digital signal input section 62 and respective resistor sections 64 connected to output terminals of third fully-differential operational amplifier 63 for eliminating high frequency components when a signal amplified in fully-differential operational amplifier 63 is provided.

In addition, a low-pass filter 70 finally filters the signal from D/A converter section 60 for decreasing the harmonic distortion.

Figure 5:
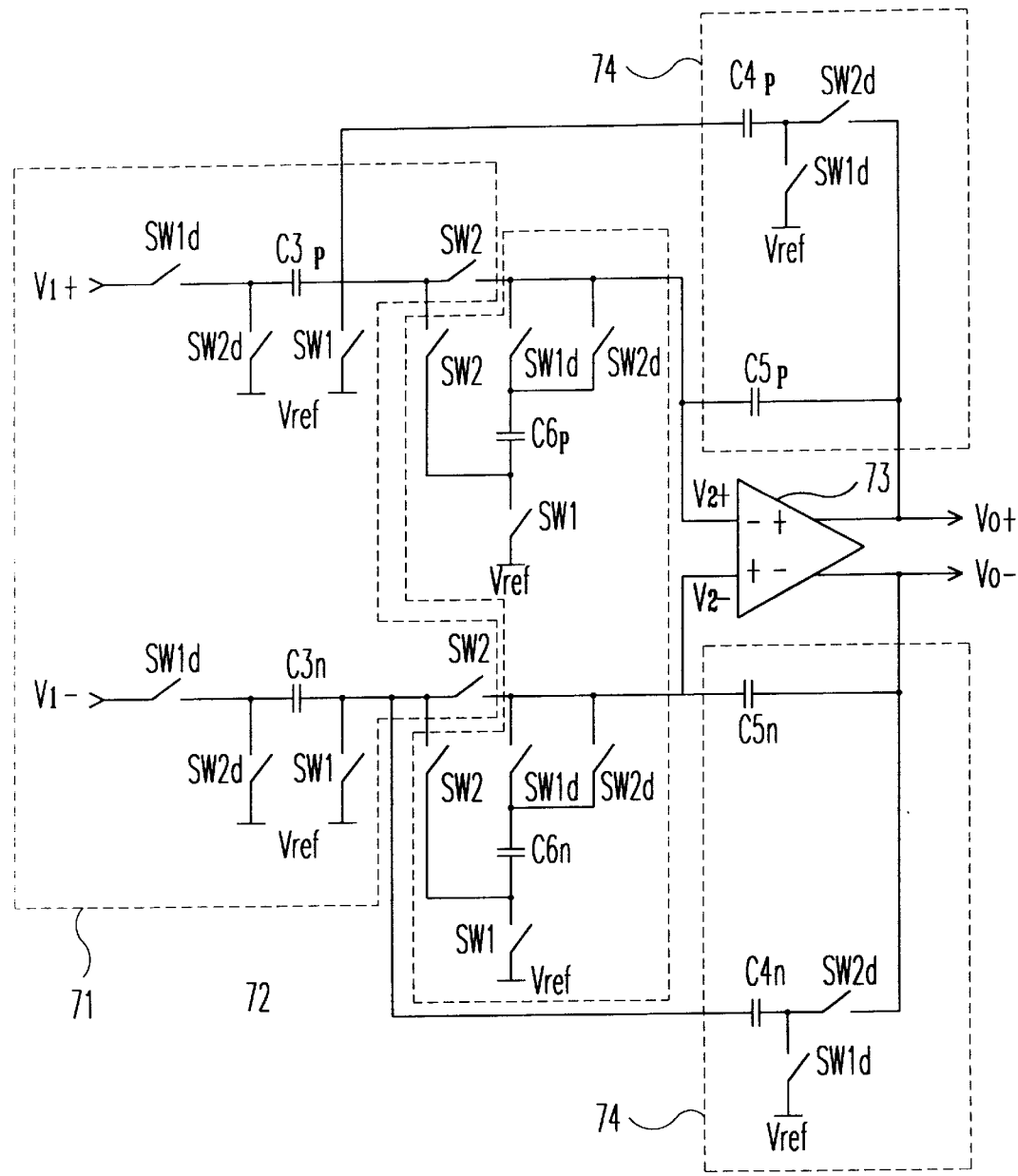
FIG. 5 is detailed circuit diagram showing the low-pass filter of FIG. 4.

Low-pass filter 70, as shown in FIG. 5, is formed by an analog signal input section 71 formed by a plurality of analog switches SW1, SW1d, SW2 and SW2d for receiving voltages $V_{1+}$ and $V_{1-}$ supplied from third fully-differential operational amplifier 63, and an input charge storing/discharging section 72 for eliminating the high frequency components of the signals supplied via analog signal input section 71. Additionally, a fourth fully-differential operational amplifier 73 amplifies the signal supplied via input charge storing/discharging section 72, and a low-pass filter section 74 eliminates a high frequency noise generated from an output terminal of fourth fully-differential operational amplifier 73.

Capacitors $C3_p$ and $C3_n$ of analog signal input section 71 are connected between one sides of connecting analog switches SW1d to switches SW2d and one sides of connecting switches SW2 and capacitors $C4_p$ and $C4_n$ of low-pass filter section 74 for serving by charging and discharging the voltage supplied from third fully-differential operational amplifier 63 of D/A converter section 60.

Input charge storing/discharging section 72 includes analog switches SW1, SW1d, SW2 and SW2d and capacitors $C6_p$ and $C6_n$ connected in the midway between analog switches (i.e., between one side of connecting switches SW1d and SW2d in parallel and one sides of connecting switches SW1 and SW2), in which capacitors $C6_p$ and $C6_n$ act for offsetting the switching noise produced during the voltage switching operation.

In low-pass filter section 74, capacitors $C4_p$ and $C4_n$ and analog switches SW1d and SW2d are used for filtering the high frequency noise together with analog switches SW1 and SW2 of analog signal input section 71.

Figure 6:
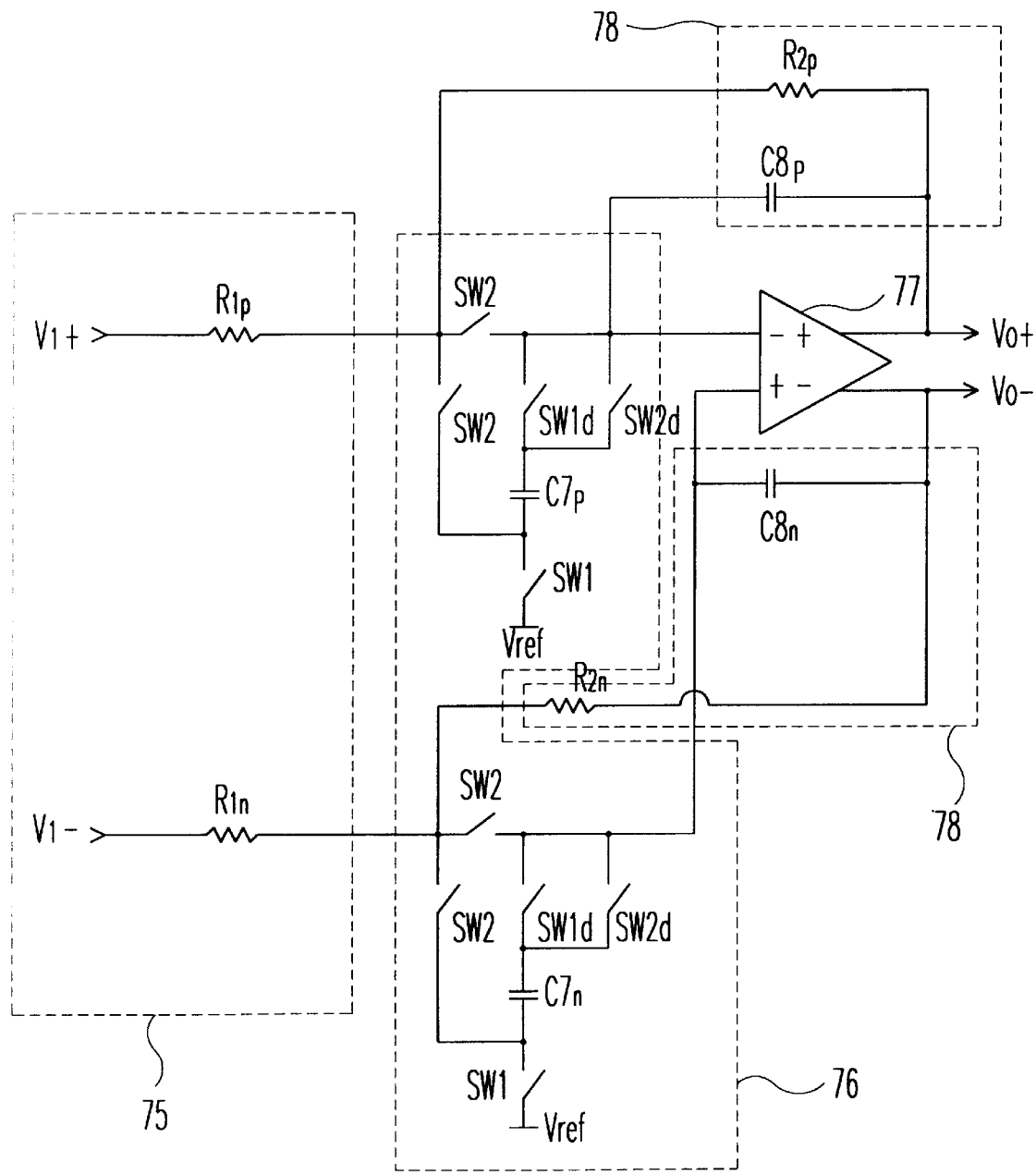
FIG. 6 is a detailed circuit diagram showing another embodiment of the low-pass filter of FIG. 4.

A circuit consisting of passive resistor devices, which is another embodiment of low-pass filter 70, as shown in FIG. 6, is formed by an analog input passive resistor section 75 for receiving the output voltage of D/A converter section 60 by using passive resistors $R1_p$ and $R2_n$ in place of analog signal input section 71, and a high frequency noise resisting/discharging section 76 for eliminating the high frequency noise produced at current which flows through analog input passive resistor section 75. Further to theses, a fifth fully-differential operational amplifier 77 amplifies the voltage received via high frequency noise resisting/discharging section 76, and a passive low-pass filter section 78 uses the passive resistors in place of the capacitors and analog switches of low-pass filter section 74 of FIG. 5 for eliminating the high frequency noise generated at the output of fifth fully-differential operational amplifier 77.

One end of passive resistors $R1_p$ and $R1_n$ of analog input passive resistor section 75 are respectively connected to the output terminals of D/A converter section 60. The other ends are respectively connected to points of encountering two analog switches SW2, and one sides of resistors $R2_p$ and $R2_n$ of passive low-pass filter section 78 are also connected to the points.

The connection of capacitors $C7_p$ and $C7_n$ of high frequency noise resisting/discharging section 76 is the same as that of capacitors $C6_p$ and $C6_n$ of input charge storing/discharging section 72 of FIG. 5, and the connection of analog switches are the same.

Capacitors $C8_p$ and $C8_n$ of passive low-pass filter section 78 are connected to be identical with those of FIG. 5, and the other sides of resistors $R2_p$ and $R2_n$ are respectively connected to the points of connecting one side of capacitors $C8_p$ and $C8_n$ to the output terminals of fifth fully-differential operational amplifier 77.

In the switched capacitor D/A converter according to the present invention as constructed above, D/A converter section 60 is operated as a primary switched capacitor filter which has a cutoff frequency of $$\frac{fC_R}{2\pi C_2}$$

(where a reference alphabet f denotes a clock frequency of respective analog switches in the relation that $C_{Rp}=C_{Rn}=C_R$, $C2_p=C2_n=C2$) with a dc gain of $$\frac{C1}{C_R}.$$

Figure 3:
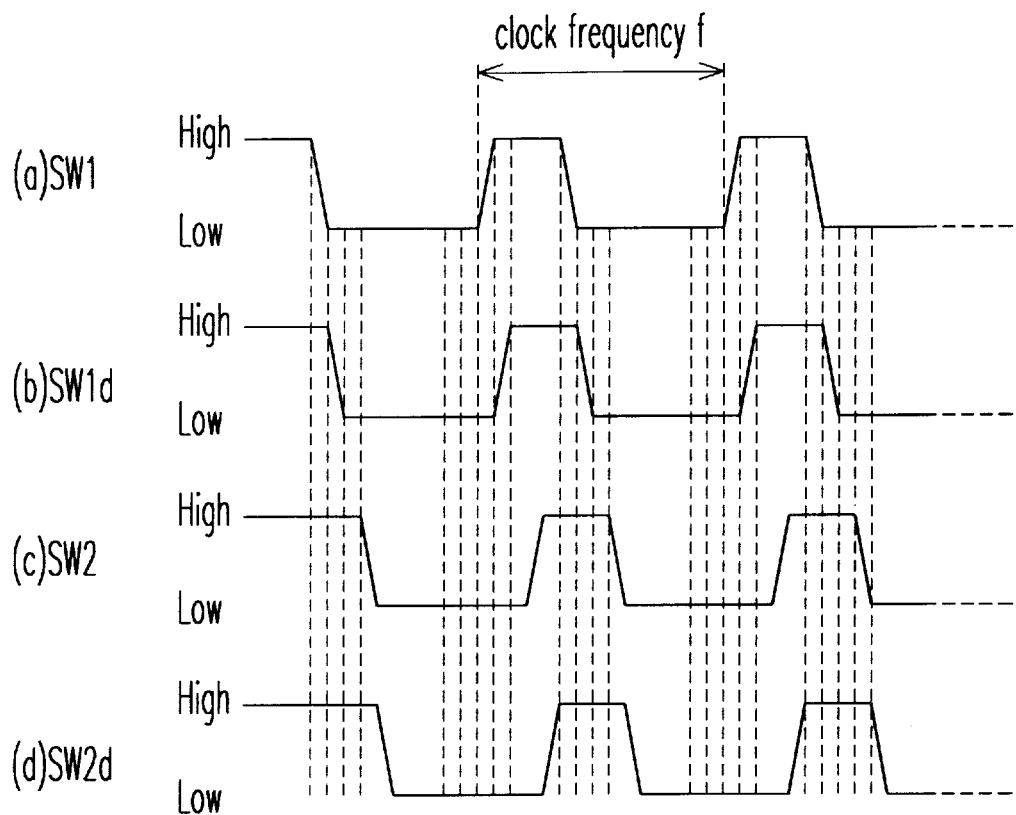
FIG. 3 is a timing chart of the clock for controlling the operation of the analog switches within the D/A converter.

In considering the operational procedure of the voltage supply section 61, when switches SW1d are on after switches SW1 are on in accordance with the clock phase of FIG. 3, both ends of capacitor $C1_p$ are charged with a voltage of $V_{ref+}-V_{ref}$. At this time, both ends of capacitor $C1_n$ are charged with a voltage of $V_{ref}-V_{ref-}$. Here, the voltages at both ends of capacitors $C_{Rp}$ and $C_{Rn}$ of resistor section 64 become zero.

Upon the completion of the charging operation, switches SW1 are off and then switches SW1d ara off, too. At this point, switch SW2 is initiated to be on and, simultaneously, the applied voltage is provided to inverted input terminal – or non-inverted input terminal + (or vice versa) of third fully-differential operational amplifier 63 in accordance with the externally-provided digital 1-bit data stream signal D value. For reference, when digital value D externally-provided as shown in FIG. 4 has a value 1, digital value /D has zero value. Accordingly, the voltage charging up capacitors $C1_p$ and $C2_n$ is discharged to the inverted input terminal and non-inverted input terminal of third fully-differential operational amplifier 63 (in which switch DSW2 denotes a fact that the clock phase of switch SW2 and digital 1-bit data stream D are logically ANDed, and switch /DSW2 denotes that the clock phase of switch SW2 and the digital 1-bit data stream reverse to the phase of D, i.e., /D, are logically ANDed.

Also, applied voltages $V_{ref+}$ and $V_{ref-}$ have the values written as:

$$V_{ref+}=V_{ref}+X$$

$$V_{ref-}=V_{ref}-X$$

where x denotes an optional positive value, and there is a relation that $V_{ref+}>V_{ref}>V_{ref-}$.

On the other hand, when the switches of digital signal input section 62 are connected to the inverted input terminal and non-inverted input terminal of third fully-differential operational amplifier 63, switches SW2 of resistor section 64 are on (at the moment switches SW2 are on for performing the discharging operation). Successively, switches SW2d of reference voltage supply section 61 and switches SW2d of resistor section 64 are simultaneously on, thereby discharging the mentioned charged voltage to capacitors $C_{Rp}$ and $C_{Rn}$ of resistor section 64.

At this time, signals of different phases (inverted signals, i.e., the phase difference of the signals is 180°) are provided from output terminal $V_{1+}$ and $V_{1-}$ of third fully-differential operational amplifier 63, and the cutoff frequency becomes $$\frac{fC_R}{2\pi C_2}$$

(where $C_{Rp}=C_{Rn}=C_R$ and $C2_p=C2_n=C2$) by capacitors $C_{Rp}$ and $C_{Rn}$ within resistor section 64 to be provided after the high frequency component is decreased. Also, the dc gain is $$\frac{C1}{C_R}$$

(where $C_{Rp}=C_{Rn}=C_R$ and $C1_p=C1_n=C1$).

Then, referring to FIG. 5, low-pass filter 70 is operated as the primary low-pass filter of which cutoff frequency is $$\frac{fC_4}{2\pi C_5}$$

(where $C5_p=C5_n=C5$, $C4_p=C4_n=C4$, and reference alphabet f denotes the clock frequency of respective analog switches) and the dc gain is $$\frac{C3}{C_4}$$

(where $C4_p=C4_n=C4$ and $C3_p=C3_n=C3$). In considering the operation thereof, when switches SW1d are on after switches SW1 are on, the output voltages of third fully-differential operational amplifier 63 are charged to capacitors $C3_p$ and $C3_n$ of analog signal input section 71, and the input high frequency noise of fourth fully-differential operational amplifier 73 is charged to capacitors $C6_p$ and $C6_n$ of input charge storing/discharging section 72. The voltages at both ends of capacitors $C4_p$ and $C4_n$ of low-pass filter section 74 become zero.

Successively, when switches SW2 are on and then switches SW2d are on after switches SW1d are off in accordance with the clock phase of FIG. 3, the previously-charged voltage, i.e., the voltage previously charging up capacitors $C3_p$ and $C3_n$ of analog signal input section 71 is discharged to capacitors $C4_p$ and $C4_n$ of low-pass filter section 74. Simultaneously, since the polarity of the voltage charging up capacitors $C6_p$ and $C6_n$ of input charge storing/discharging section 72 has the polarity inverted when switches SW2 are on, the high frequency noise is instantaneously offset to hinder the application of the great input upon the input terminal fourth fully-differential operational amplifier 73.

By this operation, the instantaneous saturation of the outputs $V_{0+}$ and $V_{0-}$ of operational amplifier 73 (i.e., the excess of a linear input range) is prevented.

Therefore, voltages $V_{2+}$ and $V_{2-}$ applied to fourth fully-differential operational amplifier 73 when switches SW2 and SW2d are on are provided as signals of which a high frequency component is eliminated. Then, when switches SW2d are off and switches SW1 are on, the above-stated series of operations are repeated.

In operation, the low-pass filter shown in FIG. 6 which is another embodiment, once the voltage provided from fully-differential operational amplifier 63 of D/A converter section 60 is applied, the input high frequency noise of fifth fully-differential operational amplifier 77 is charged into capacitors $C7_p$ and $C7_n$ within high frequency noise resisting/discharging section 76, and the voltages at both ends of capacitors $C8_p$ and $C8_n$ of passive low-pass filter section 78 become zero.

After this, when switches SW2 are on and then switches SW2d are on after switches SW1d are off in accordance with the clock phase of FIG. 3, the applied voltage is discharged to capacitors $C8_p$ and $C8_n$ of passive low-pass filter 78. At the same time, since the voltage previously charging up high frequency noise resisting/discharging section 76 is to have an inverted polarity when switches SW2 are on, the high frequency noise is instantaneously offset to hinder the apply of a great input upon the input terminal of fifth fully-differential operational amplifier 77.

By this operation, the instantaneous saturation at outputs $V_{0+}$ and $V_{0-}$ of operational amplifier 77 (i.e., the excess of the linear input range) is prevented.

When the system for eliminating the high frequency component by means of the D/A converter section and low-pass filter according to the present invention operated as above is expressed via an origin of generating the harmonic component and a preventing method thereof, it can be defined as the following equation.

In expressing currents $I^+$ and $I^-$ supplied to the input terminals of the fully-differential operational amplifier, $$I^+=C3_p f(V_1-V_2)(1+m_1 \sin(pt)+m_2 \sin(2pt)+$$

and $$I^-=C3_n f(V_1+V_2)(1-m_1 \sin(pt)-m_2 \sin(2pt)+$$

provided that $V_{1+}=V_1$, $V_{2+}=V_2$ and $V_{2-}=-V_2$ since voltages $V_{1+}$ and $V_{1-}$ are opposite to each other when the reference voltage is set as a reference (i.e., the signals having the phases different by as many as 180°).

By summarizing the above two equations, $$I^+I^-=f(V_1-V_2)(C3_p-C3_3)+f(V_1-V_2)m_1 \sin(pt)(C3_p+C3_n)-f(V_1-V_2)m_2 \sin(2pt)(C3_p+C3_n)+$$

where a reference numeral $m_1$ is a magnitude component of the first harmonic wave, $m_2$ is a magnitude component of the second harmonic wave, and p is the frequency component of the switching clock.

In this state, when it is assumed that capacitors $C3_p$ and $C3_n$ are matched to each other, i.e., $C3_p=C3_n=C3$, the sum of the current is written as below:

$$I^+I^-=2C1f_s(V_1-V_2)m_1 \sin(pt)+2C1f_s(V_1-V_2)m_2 \sin(2pt)+$$

In the above equation, the distortion becomes minimum when $V_1=V_2$, i.e., $V_{1+}=V_{2+}$ and $V_{1-}=V_{2-}$ in FIG. 5.

However, it is impossible to obtain such a case, because the high frequency distortion can be decreased by reducing the magnitude of the member $V_2$ ($V_{2+}$ and $V_{2-}$ of FIG. 5). More specifically, providing that the gain of the fully-differential operational amplifier is denoted by A and the output voltage has a value $V_0$ within the range capable of being linearly changed, the distortion can be decreased by providing the member $V_2$ that satisfies the following relation of $V_2<V_0/A$, i.e., the input voltage of the operational amplifier is operated within the linear range.

In the D/A converter according to the present invention as described above, when the high frequency component of the signal received in the conventional D/A converter is eliminated, the high frequency component is eliminated in accordance with the capacitance of bypass capacitor $C_B$ designed to conventional D/A converter section 40. Thus, the increased designing area problem is solved by the low-pass filter portion by using the analog switches and capacitors in place of the bypass capacitors, thereby shrinking the designing area and involving the greater dynamic range.

Furthermore, low-pass filter 70 can be modified as shown in FIGS. 5 and 6 to be selectively employed by considering respective advantages in accordance with the characteristics of the corresponding circuits. It is also appreciable that the analog switches utilized in the D/A converter are of a variety of types to be modified in design in accordance with the convenience of the designer and circuit characteristics.

For reference, by designing the D/A converter as described above, the prior dynamic range is 83 dB and that of the present invention is 93 dB, noting that the dynamic range of the D/A converter according to the present invention is improved by as many as 10 dB when the analog signals provided from the low-pass filter are subjected to the Fast Furrier Transform to compare the frequency spectrums within a band provided that the digital 1-bit data stream having the dynamic range of 96 dB is used as the input of the D/A converter and the sampling frequency is 2.8224 MHz (by 64×input word rate).

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A switched-capacitor digital-to-analog converter (DAC) with decreased harmonic distortion, the DAC comprising:
   a) a digital-to-analog converter section; and
   b) a low-pass filter including:
      1) an analog signal input section including plural analog switches for receiving a voltage from the digital-to-analog converter section;
      2) an input charger storing/discharging section that eliminates high frequency components of signals from the analog signal input section, the input charger storing/discharging section including capacitors connected between the plural analog switches and analog switches that offset switching noise produced during voltage switching;
      3) a fully-differential operational amplifier that amplifies signals received from the input charger storing/discharging section; and
      4) a low-pass filter section that eliminates high-frequency noise produced from an output of the fully-differential operational amplifier.

2. The DAC of claim 1, wherein the analog switches constitute:
   plural switches connected in parallel, each of which has a first side connected to an input terminal of the fully-differential operational amplifier and a second side connected to a capacitor;
   wherein the plural switches receive clock signals of phases that are opposite to each other.

3. A switched-capacitor digital-to-analog converter (DAC) with decreased harmonic distortion, the DAC comprising:
   a) a digital-to-analog converter section; and
   b) a low-pass filter including:
      1) an analog input passive resistor section including plural passive resistor devices for receiving a voltage from the digital-to-analog converter section;
      2) a high-frequency noise resisting/discharging section that eliminates high-frequency noise generated by current flowing through the analog input passive resistor section, the high-frequency noise resisting/discharging section including capacitors connected between the analog input passive resistor section and analog switches that offset switching noise produced during voltage switching;
      3) a fully-differential operational amplifier that amplifies the voltage received from the high-frequency noise resisting/discharging section; and
      4) a low-pass filter section that eliminates high-frequency noise produced from an output of the fully-differential operational amplifier, the low-pass filter section formed by passive resistor devices.

4. The DAC of claim 3, wherein the analog switches constitute:
   plural switches connected in parallel, each of which has a first side connected to an input terminal of the fully-differential operational amplifier and a second side connected to a capacitor;
   wherein the plural switches receive clock signals of phases that are opposite to each other.

* * * * *